United States Patent [19]
Natori

[11] Patent Number: 5,198,994
[45] Date of Patent: Mar. 30, 1993

[54] FERROELECTRIC MEMORY DEVICE

[75] Inventor: Kenji Natori, Kawasaki, Japan

[73] Assignee: Kabushiki Kaisha Toshiba, Kawasaki, Japan

[21] Appl. No.: 789,538

[22] Filed: Nov. 8, 1991

Related U.S. Application Data

[63] Continuation of Ser. No. 399,935, Aug. 29, 1989, abandoned.

[30] Foreign Application Priority Data

Aug. 31, 1988 [JP] Japan .................. 63-214910

[51] Int. Cl.$^5$ .................. G11C 11/22; H01L 29/34
[52] U.S. Cl. .................. 365/145; 365/184; 365/185; 257/295
[58] Field of Search .................. 365/145, 184, 185; 357/23.5, 54

[56] References Cited

U.S. PATENT DOCUMENTS

| | | | |
|---|---|---|---|
| 3,832,700 | 8/1974 | Wu et al. .................. | 365/145 |
| 3,911,464 | 10/1975 | Chang et al. .................. | 357/54 |
| 3,943,547 | 3/1976 | Nagano et al. .................. | 357/54 |
| 4,000,427 | 12/1976 | Hoffmann .................. | 365/187 |
| 4,161,038 | 7/1979 | Wu .................. | 365/145 |
| 4,348,611 | 9/1982 | Ruppel et al. .................. | 357/29 X |
| 4,380,804 | 4/1983 | Lockwood et al. .................. | 365/184 |
| 4,716,548 | 12/1987 | Mochizuki .................. | 365/187 |
| 4,855,955 | 8/1989 | Cioaca .................. | 365/187 |

FOREIGN PATENT DOCUMENTS 50-15446 2/1975 Japan .

OTHER PUBLICATIONS

Anderson, "Ferroelectric Storage Elements for Digital Computers & Switching Systems," *Electrical Engineering*, Oct. 1952, pp. 916–922.
Pulvira, "Research on Application of Ferro- and Ferrielectric Phenomena in Computers Devices", Oct. 1963, pp. 1–42.
"New Challenger: The Ferroelectric Ram," *Electronics*, Feb. 4, 1988, pp. 32.
"A New Memory Technology is About to Hit the Market," *Electronics*, Feb. 18, 1988, p. 91.
"Ferroelectric Capacitors are RAMTRON's Bright Idea," *Electronics*, Feb. 18, 1988, pp. 91–94.
"Krysalis Puts Data Directly in Ferroelectric Cells," *Electronics*, Feb. 18, 1988, pp. 94–95.

*Primary Examiner*—Joseph L. Dixon
*Assistant Examiner*—Michael A. Whitfield
*Attorney, Agent, or Firm*—Finnegan, Henderson, Farabow, Garrett and Dunner

[57] ABSTRACT

A nonvolatile semiconductor memory including multiple memory cells. Each memory cell comprises a FET TM having a ferroelectric insulation film and two MOS transistors T1 and T2 connected in series to the ends of the source-drain path of the FET, respectively. To write data into a memory cell, an electric field is applied in a predetermined direction between the gate and the substrate of the transistor TM. The electric field polarizes the gate insulation film of the transistor TM, which is made of ferroelectric material, in the direction, thereby writing data into the memory cell. In a data read mode, if the transistor TM is on, a current flows through the transistor TM, and the potential of a bit line to which the transistor TM is coupled decreases. In contrast, if the transistor TM is off, no currents flow through this transistor TM, and the potential of the bit line to which the transistor TM is coupled remains unchanged. Thus, the data stored n the memory cell can be discriminated by detecting whether the potential of the bit line corresponds to a "1" bit or a "0" bit.

23 Claims, 7 Drawing Sheets

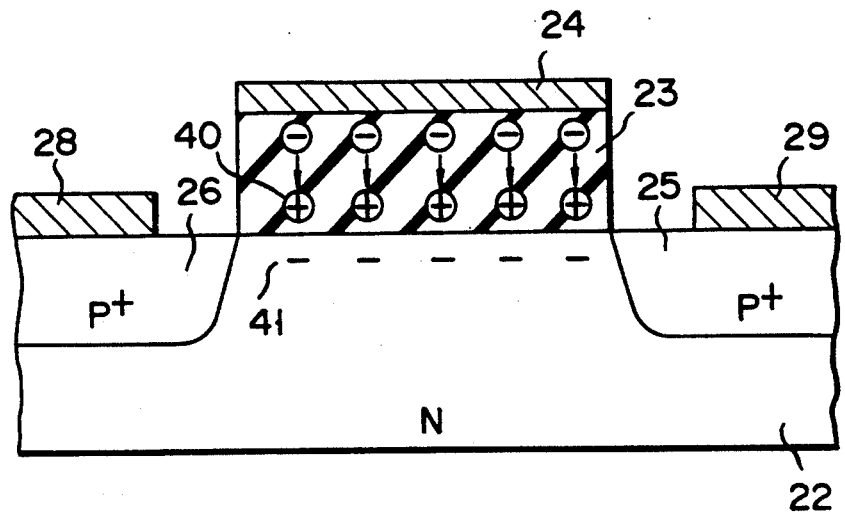
F I G. 5A
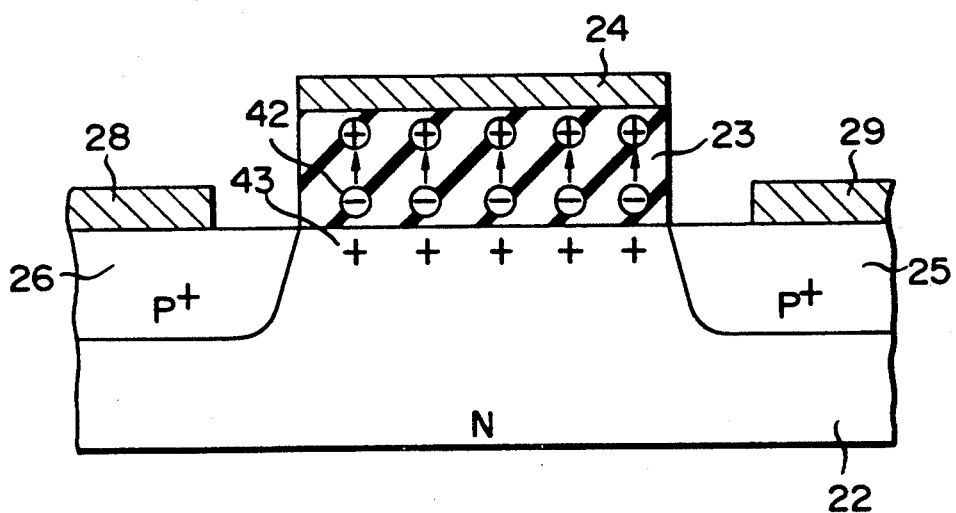
F I G. 5B

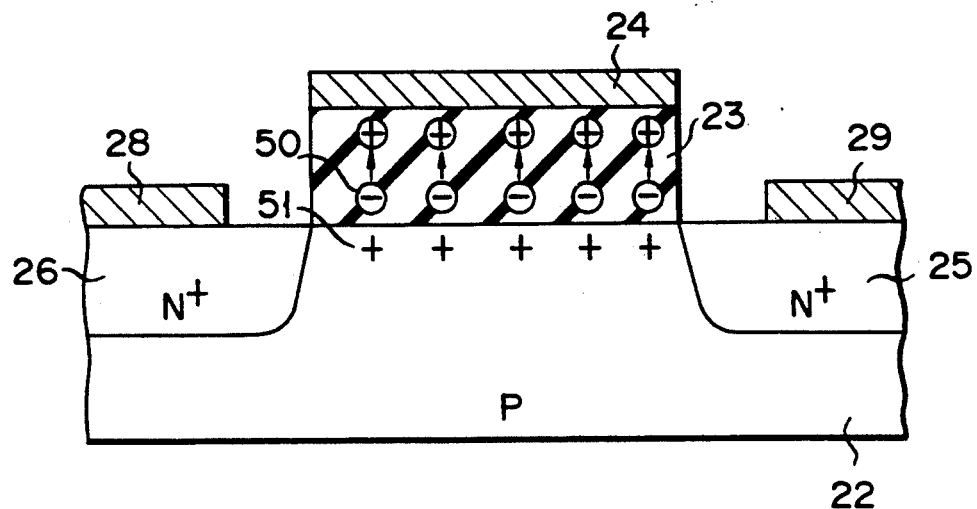
F I G. 9A
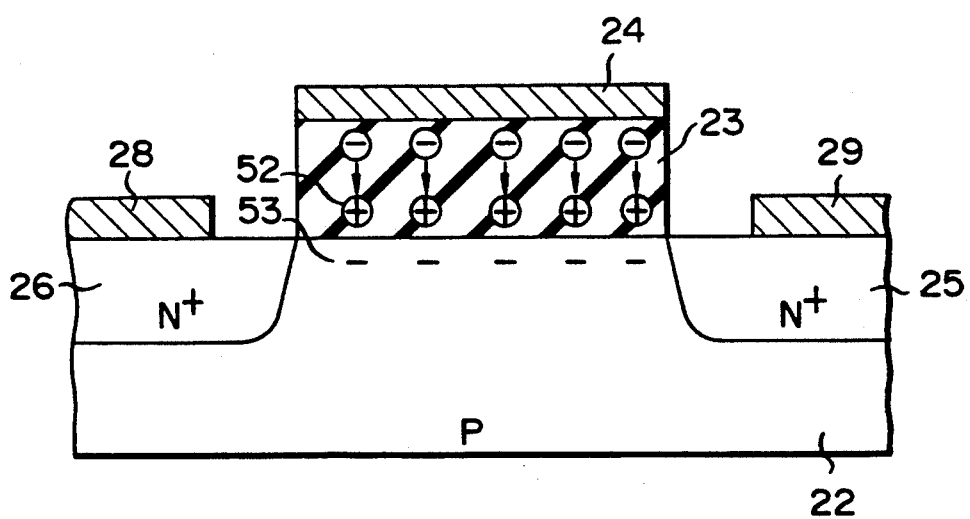
F I G. 9B

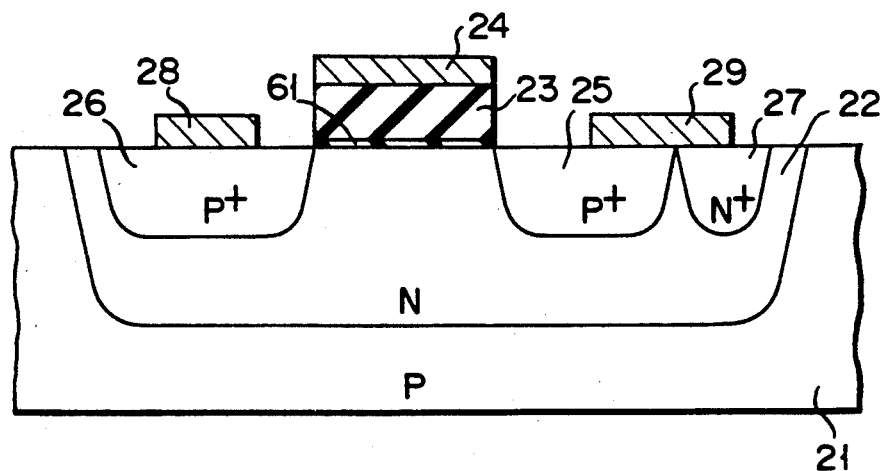
F I G. 10
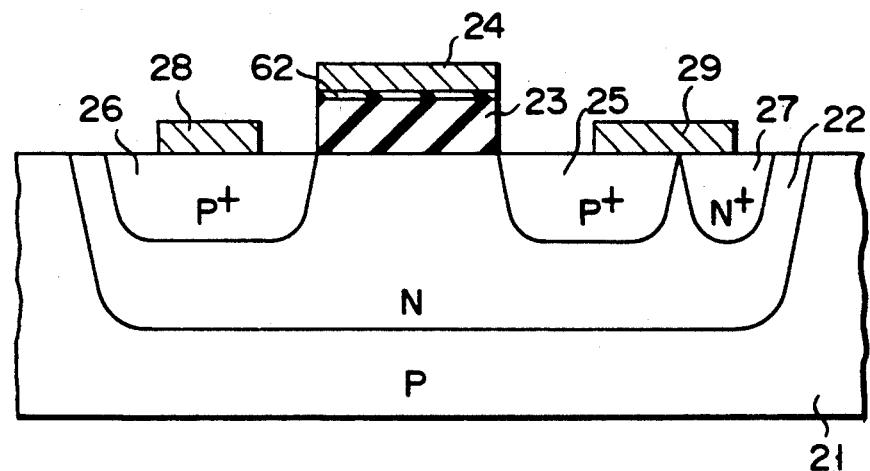
F I G. 11
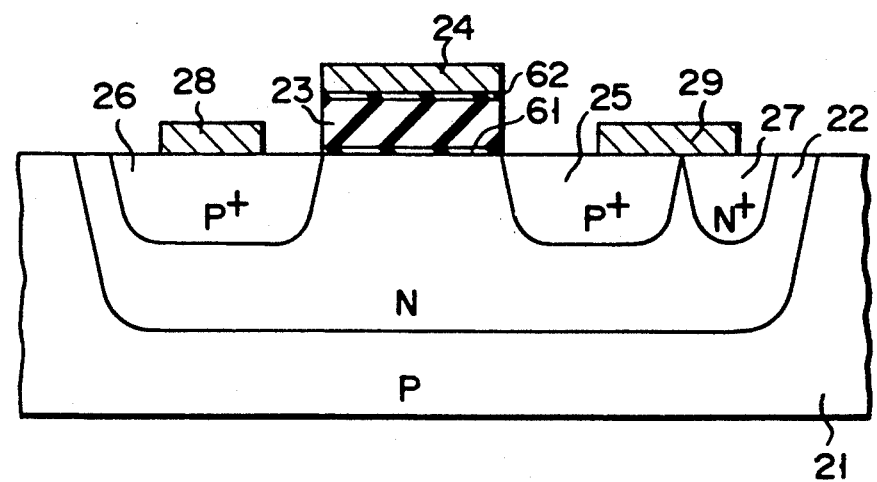
F I G. 12

FERROELECTRIC MEMORY DEVICE

This application is a continuation of application Ser. No. 07/399,935, filed Aug. 29, 1989, now abandoned.

BACKGROUND OF THE INVENTION

1. Field of the Invention

The present invention relates to a nonvolatile semiconductor memory device comprising field-effect transistors (FETs) which are used in memory cells and have a gate insulation film made of ferroelectric material.

2. Description of the Related Art

Known as a memory element is such a gate-insulated transistor as is shown in FIG. 1, which has a floating gate electrode 74. This memory element is used in an EPROM (Electrically Programmable Read-Only Memory).

To write data into the floating-gate transistor shown in FIG. 1, a high voltage is applied to the drain region 71 and the control gate electrode 72, causing an avalanche breakdown and injecting electrons into the floating gate through the gate insulation film 73, thereby to change the threshold voltage of the transistor. The voltage applied to the control gate electrode 72 is controlled to render the path between the drain region 71 and the source region 75, either conductive or non-conductive. However, whether this source-drain path is conductive or not depends on the threshold voltage of the transistor, which varies in accordance with the electrical charge of the floating gate electrode 74. Since the floating-gate transistor shown in FIG. 1 is an N-type one, its threshold voltage is low when no electrons have been injected into the floating gate electrode 74, and is high when electrons have been injected into the electrode 74.

The data, i.e., a "1" bit or a "0" bit, written in the transistor, can be detected in accordance with whether or not the source-drain path is conductive, or whether or not electrons are accumulated in the floating gate electrode 74 when a predetermined voltage is applied to the control gate electrode 72. To erase the data from the floating-gate transistor, it suffices to apply ultraviolet rays onto the transistor, thereby releasing the electrons from the floating gate electrode 74.

However, it takes much longer to write data into the transistor, than to read the data therefrom. This is because the data is written into the floating-gate transistor by applying a high voltage to the transistor, thus causing an avalanche breakdown and injecting electrons into the floating gate through the gate insulation film 73. Moreover, to erase the data from the floating-gate transistor, ultraviolet rays must be applied to the transistor, which requires a special device to apply the rays and also some time to do so.

In view of the drawbacks pointed out in the preceding paragraph, the floating-gate transistor is not suitable for use as a memory cell of a RAM (Random-Access-Memory) which write data within a time not greatly different from the time required to read the data.

Recently, a capacitor, which has an insulation film made of ferroelectric material and interposed between the two electrodes and which can function as a memory cell, has been disclosed in *Electronics*, Feb. 4, 1988, p. 32, and also in *Electronics*, Feb. 18, 1988, pp. 91–95). The polarization of the ferroelectric material is utilized to indicate the data. It is easy to write data into, and to read data from, this capacitor. Since the capacitor keeps storing the data even after the power supply to it is stopped, it is useful as a memory cell of a nonvolatile memory.

To write data into, or read data from, a capacitor which has a ferroelectric insulation film and is used as a memory cell of a nonvolatile RAM, the polarization of the insulation film must be inverted. Here arises a problem. Since the ferroelectric insulation film fails to function normally after it has undergone inversion of polarization a predetermined number of times, the capacitor cannot be used long as a memory cell.

On the other hand, the ferroelectric gate insulation film of a FET used as a memory cell need not undergo inversion of polarization to read data, though it must undergo this phenomenon to write data. Hence, the FET can be used longer as a memory cell than the capacitor described above. It is demanded that some measures be taken which make it possible to use FETs as memory cells practically.

SUMMARY OF THE INVENTION

Accordingly, it is the object of the present invention to provide a nonvolatile semiconductor memory which has memory cells each comprising an FET having a ferroelectric gate insulation film, and which can rewrite data in a short period of time.

According to the invention, there is provided a nonvolatile semiconductor memory which has an array of memory which has an array of memory cells arranged in rows and columns, each memory cell comprising a FET TM having a ferroelectric insulation film and two MOS transistors T1 and T2 connected in series to the ends of the source-drain path of the FET, respectively.

To write data into each memory cell, the transistor T1 is turned on, and the transistor T2 is turned off. Then, a voltage is applied to the transistor TM from the bit line BL to which the transistor TM is connected, and an electric field is applied in a predetermined direction between the gate and the substrate of the transistor TM. As a result of this, the gate insulation film of the transistor TM, which is made of ferroelectric material, polarized in said direction, and the data is written into the memory cell.

On the other hand, to read data from each memory cell, the transistor T2 is turned on, and the transistor T1 is turned off. All bit lines BL have been precharged to a prescribed potential. Hence, if the transistor TM is on, a current flows through the transistor TM, and the potential of the bit line to which the transistor TM is coupled decreases. In contrast, if the transistor TM is off, no currents flow through this transistor TM, and the potential of the bit line to which the transistor TM is coupled remains unchanged. Thus, the data stored in the memory cell can be discriminated by detecting whether the potential of the bit line BL corresponds to a "1" bit or a "0" bit.

BRIEF DESCRIPTION OF THE DRAWINGS

FIG. 5A is a sectional view of the memory cell shown in FIG. 3, in which the ferroelectric gate-insulation film is polarized in a direction;

FIG. 5B is a sectional view of the memory cell shown in FIG. 3, in which the ferroelectric gate-insulation film is polarized in a direction opposite to the direction in FIG. 5A;

FIG. 9A is a sectional view of the memory cell shown in FIG. 8, in which the ferroelectric gate-insulation film is polarized in a direction;

FIG. 9B is a sectional view of the memory cell shown in FIG. 8, in which the ferroelectric gate-insulation film is polarized in a direction opposite to the direction in FIG. 9A;

FIG. 10 is a sectional view showing a modification of the memory cell shown in FIG. 3;

FIG. 11 is a sectional view showing another modification of the memory cell shown in FIG. 3;

FIG. 12 is a sectional view showing a further modification of the memory cell shown in FIG. 3;

DETAILED DESCRIPTION OF THE PREFERRED EMBODIMENTS

Figure 2:
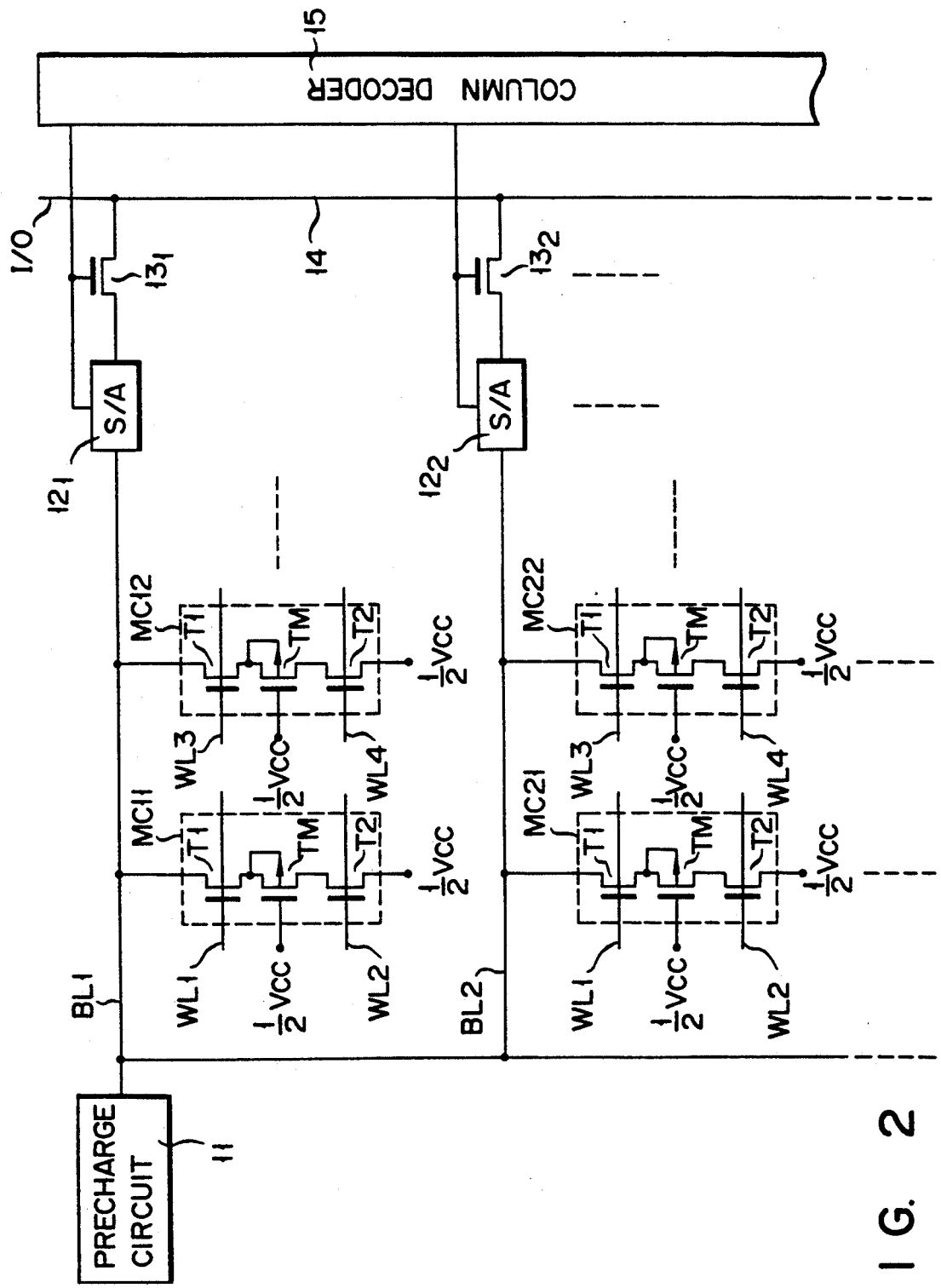
FIG. 2 is a block diagram showing a static random-access memory according to a preferred embodiment of the present invention.

An embodiment of the invention will now be described, with reference to the accompanying drawings. FIG. 2 is a block diagram showing a static random-access memory (SRAM) according to a preferred embodiment of the invention. As is illustrated in FIG. 2, the RAM has an array of memory cells MC11, MC12, ... MC21, and MC22 ... which are arranged in rows and columns.

The SRAM further comprises a precharge circuit 11, sense amplifiers $12_1$, $12_2$, ..., column-gate MOS transistors $13_1$, $13_2$, ..., an I/O bus 14, a column decoder 15, and bit lines $BL_1$, $BL_2$, ... The bit lines $BL_1$, $BL_2$, ... are connected at one end to the precharge circuit 11, and at the other end to the I/O bus 14 by the sense amplifiers $12_1$, $12_2$, ... and the column-gate transistors $13_1$, $13_2$, ..., respectively. The gates of the column-gate transistors $13_1$, $13_2$, ... are connected the column decoder 15. The signal output by the column decoder 15 selects one of MOS transistors $13_1$, $13_2$, ... The memory cells MC11, MC12, ... are connected to the bit line BL1, whereas the memory cells MC21, MC22, ... are coupled to the bit line BL2. The precharge circuit 11 is designed to precharge the bit lines BL1, BL2, ... to a potential (Vcc/2+α), where Vcc is the power-supply potential, and α is a positive voltage by which the potential of the bit lines BL1, BL2, ... becomes higher than Vcc/2 applied to MOS transistors T2 of the memory cells MC11, MC12, ..., allowing current to flow through a memory cell when the MOS transistors T1 and T2 of a memory cell are turned on.

The memory cell MC11 comprises a P-channel MOS (Metal Oxide Semiconductor) transistor TM and N-channel MOS transistors T1 and T2. The MOS transistor TM has a gate insulation film made of ferroelectric material. The MOS transistors T1 and T2, both being of the ordinary type, are connected in series between the ends of the source-drain path of the MOS transistor TM. The MOS transistor T1 is coupled to the bit line BL1, and the MOS transistor T2 is set at a reference potential of Vcc/2. The gate of MOS transistor TM is also connected.

to the reference potential of Vcc/2. The gate of the MOS transistor T1 is connected to a word line WL1, and the gate of the MOS transistor T1 is coupled to a word line WL2. The substrate and source of the MOS transistors TM are connected to each other.

All other memory cells have the same structure as the memory cell MC11, but are connected to different bit lines and/or different word lines. More precisely, the gates of the MOS transistors T1 and T2 of the memory cell MC12 are connected to word lines WL3 and WL4, respectively. The gates of the MOS transistors T1 and T2 of the memory cell MC21 are coupled to the word lines WL1 and WL2, respectively. The gates of the MOS transistors T1 and T2 of the memory cell MC22 are coupled to the word lines WL3 and WL4, respectively. The MOS transistor T1 of the memory cell MC12 is coupled to the bit line BL1. The MOS transistors T1 of the memory cells MC21 and MC22 are coupled to the bit line BL2.

Figure 1:
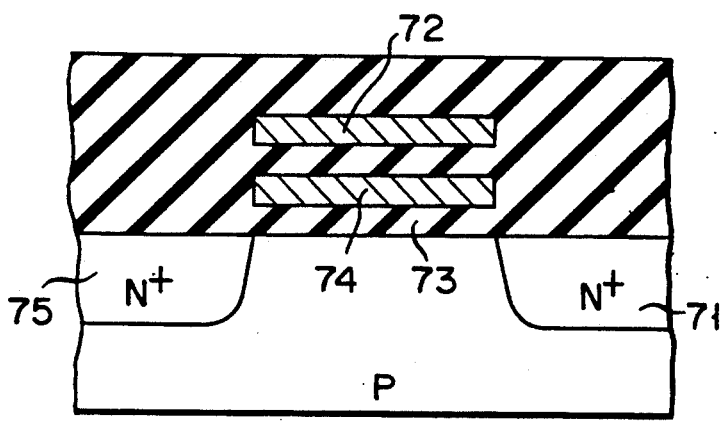
FIG. 1 is a sectional view illustrating a conventional MOS transistor having a floating gate electrode.
Figure 3:
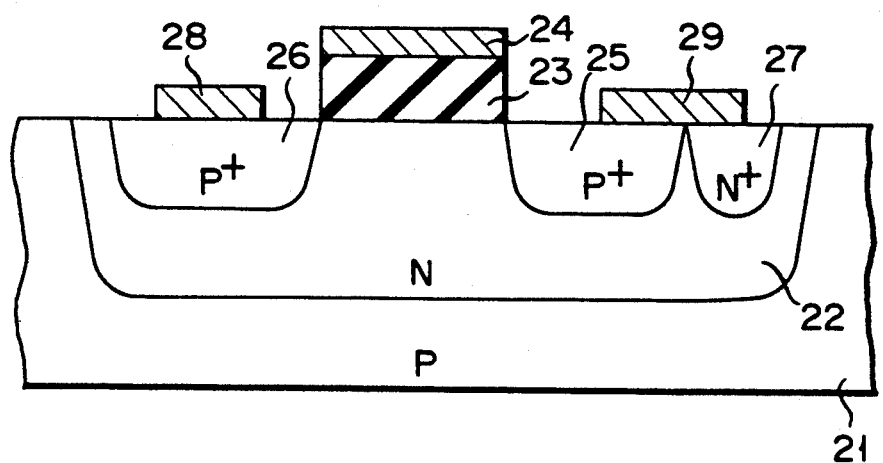
FIG. 3 is a sectional view showing one of the identical memory cells used in the memory shown in FIG. 2.

With reference to FIG. 3, the MOS transistor TM will be described in more detail. As is understood from FIG. 3, which is a cross-sectional view of the MOS transistor TM, an N-type well region 22 is formed in the surface of a P-type semiconductor substrate 21. A thin gate insulation film 23 is formed on a portion of the N-type well region 22. A control gate electrode 24 made of conductive material, for example, polycrystalline silicon is formed on the gate-insulating film 23. A source region 25 and a drain region 26 are formed in the N-type well region 22, both being P-type diffusion layers having a high impurity concentration and located on the sides of that portion of the N-type well region 22 which is covered with the thin gate-insulating film 23. A contact region 27, or an N-type diffusion layer having a high impurity concentration, is formed in the N-type well region 22, in contact with the source region 25.

A drain electrode 28 made of, for example, aluminum is formed on the drain region 26. A source electrode 29 made of, for example, aluminum is formed on the well region 25 and the contact region 27.

The ferroelectric material forming the gate insulation film 23 is $BaTiO_3$ or PZT (Lead Zirconate Tinatate).

It will now be explained how the MOS transistor TM having the gate insulation film 23 made of such a ferroelectric material operates, with reference to FIG. 4 and FIGS. 5A and 5B.

Figure 4:
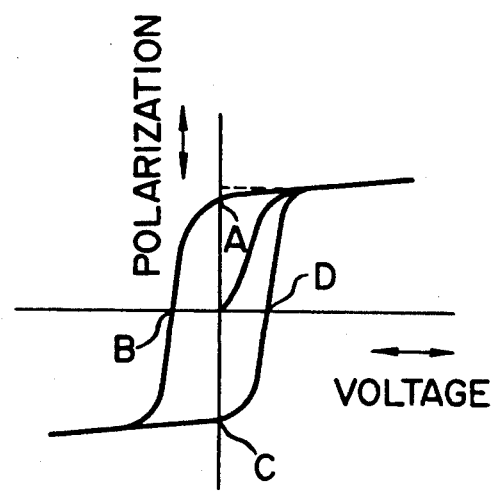
FIG. 4 is a diagram representing the hysteresis of the ferroelectric material forming the gate insulation film of the memory cell shown in FIG. 3.

As is generally known, ferroelectric material has such hysteresis as is illustrated in FIG. 4. As the intensity of the electric field applied to an element made of ferroelectric material is increased gradually, this element is gradually polarized until the polarization reaches a positive saturation. If the intensity of the electric field is reduced thereafter, the degree of polarization decreases. However, the element remains positively polarized at degree A even when the the intensity of the electric field is reduced to zero. As the intensity of the electric further reduced gradually, the element is gradually polarized until the polarization reaches a negative saturation. If the intensity of the electric field is increased thereafter, degree of polarization increases gradually. Nonetheless, the element remains negatively polarized at degree C even when the the intensity of the electric field is increased to zero. When the electric field applied on the element is increased to a value D, the element is no longer polarized.

Hence, data can be written into the MOS transistor TM having the gate insulation film 23 made of ferroelectric material, by rendering the residual polarization of the film 23 either positive or negative.

More specifically, when an electric field is applied which extends from the control gate electrode 24 to the well region 22 as is illustrated in FIG. 5A, the gate insulation film 23 is polarized, where positive charges are drawn toward the well region 22. Even when the gate control electrode 24 is set at the ground potential, and thus the electric field is no longer applied the gate insulation film 23 remains polarized toward the substrate 22. The surface region of the well region 22 therefore accumulate negative charges 41 to cancel out the positive charges 40 accumulated in the film 23, and thus forms a negative charge accumulating layer 41. As a result, the source region 25 and the drain region 26 are electrically isolated from each other by this negative charge accumulating layer 41.

On the other hand, when an electric field is applied which extends from the well region 22 to the control gate electrode 24 as is illustrated in FIG. 5B, the gate insulation film 23 is also polarized, where negative charges are drawn toward the control gate electrode 24. In this case, even when the well region 22 and the electrode 24 are set at the ground potential, and thus the electric field is no longer applied, the gate insulation film 23 remains polarized toward the control gate electrode 24. The surface region of the well region 22 therefore accumulate positive charges 43 to cancel out the negative charges 42 accumulated in the film 23, and thus forms a positive charge accumulating layer 43. As a result, the source region 25 and the drain region 26 are electrically connected by this positive charge accumulating layer 43.

As can be understood from the above, a "1" bit or a "0" bit is written into the MOS transistor TM by applying an electric field which extends either from the well region 22 to the control gate electrode 24, or from the control gate electrode 24 to the well region 22, thereby forming a positive or negative charge accumulating layer in the gate insulation film 23 made of ferroelectric material.

The time required for writing data into the FET having the gate insulation film 23 made of ferroelectric material is equal to the switching time required for inverting the polarization. As is generally known in the art, this switching time is proportional to the thickness of the gate insulation film 23 and inversely proportional to the effective intensity of the electric field applied to the control gate electrode 24, which is nearly equal to the difference between the intensity of the electric field and the coercive force. Hence, if the film 23 is sufficiently thin, a relatively low voltage, for instance $V_{cc}/2 (=2.5$ V, where $V_{cc}=5$ V), suffices to invert the polarization, thus writing data into the FET at a sufficiently high speed.

When the gate insulation film 23 is made of $BaTiO_3$ and 1 µm thick, and the voltage of about 1 V is applied to the control gate electrode 24, the switching time is as short as 4 ns, and the data can be written into the FET within a short time.

In a PROM having the conventional MOS transistors, each having a floating gate electrode, a high voltage of 10 V or more must be applied to the gate control electrode of each MOS transistor to write data into the MOS transistor, and a time of 1 ms or more must be required to write data into the MOS transistor.

Figure 6A:
FIGS. 6A, 6B, and 6C form a timing chart explaining how the potentials of the word lines and bit lines of the memory shown in FIG. 3 are changed to write data into the memory.
Figure 6B:
Figure 6C:

It will now be explained how data is written into, and read from, the memory cells of the SRAM illustrated in FIG. 2, with reference to FIGS. 6A to 6C and also FIGS. 7A to 7D.

Data is written into, for example, the memory cell MC11 in the following way. First, the column decoder 15 selects the bit line BL1. A row decoder (not shown) sets the first word line WL1 at the potential of Vcc as is shown in FIG. 6A, thus turning on the transistor T1 of the memory cell MC11, and sets the second word line WL2 at the ground potential (i.e., the potential of Vss) as is shown in FIG. 6B, thus turning off the transistor T2 of the memory cell MC11. As a result, the data potential on the bit line BL1 is applied to the source and substrate of the transistor TM of the memory cell MC11. A potential of Vcc/2 is therefore applied between the gate and substrate of the transistor TM, and the gate insulation film 23 thereof is electrically polarized, whereby the data is written into the memory cell MC11.

Figure 7A:
FIGS. 7A, 7B, 7C, and 7D form a timing chart explaining how the potentials of the word lines and bit lines of the memory are changed to read data from the memory.
Figure 7B:
Figure 7C:
Figure 7D:

The data is read from the memory cell MC11 in the following way. First, the row decoder sets the second word line WL2 at the potential of Vcc as is shown in FIG. 7B, thus turning on the transistor T2 of the memory cell MC11, and sets the first word line WL1 also at the the potential of Vcc as is shown in FIG. 7A, thus turning on the transistor T1 of the memory cell MC11. The precharge circuit 11 has already precharged the bit line BL1 to a potential $(=V_{cc}/2+\alpha)$ higher than Vcc/2, as is shown in FIG. 7C. Hence, when the transistor TM of the memory cell MC11 is conducting, a current flows through the memory cell MC11 from the bit line BL1 to which the transistor TM is connected, whereby the potential of this bit line BL1 is decreased. By contrast, when any transistor TM coupled to the bit line BL1 is not conducting, no currents flow through the memory cells connected to the bit line BL1. In this case, the potential of the bit line BL1 remains unchanged. Assuming that the memory cell MC11 stores a "1" bit while the transistor TM is conducting, and a "0" bit while transistor TM is not conducting, the data stored in the cell MC11 can be discriminated by detecting the potential of the bit line BL1 by means of the sense amplifier $12_1$ as is shown in FIG. 7D.

Data can be written into, and read from, any memory cell other than the memory cell MC11, basically in the same manner, through in a somewhat different way since the memory cell is connected to a different bit line and/or different word lines.

The bit lines BL1, BL2, . . . must be precharged to a potential higher than Vcc/2, or potential of $V_{cc}/2+\alpha$ in order to correctly read data from the memory cells in the read mode. If the bit lines are precharged to a potential equal to Vcc/2, no current flows through the transistor TM so that data cannot be read out.

The number of times a good polarization inversion can occur in ferroelectric material is approximately 10¹⁰. In the above mentioned memory cells MC, the polarization inversion does not occur in the data read mode. Thus, the memory cell MC can be used in place of a conventional EEPROM into which data is not written too often.

In the embodiment described above, the source of the transistor TM is connected to the substrate on which the gate insulating film 23 made of ferroelectric material is formed, and a predetermined voltage is applied to the gate of the transistor TM. The present invention is not limited to this embodiment, however. The source can be connected to any other part, provided that the predetermined voltage is applied between the substrate and the gate of the transistor TM to invert the residual polarization in the the gate insulation film 23.

Figure 8:
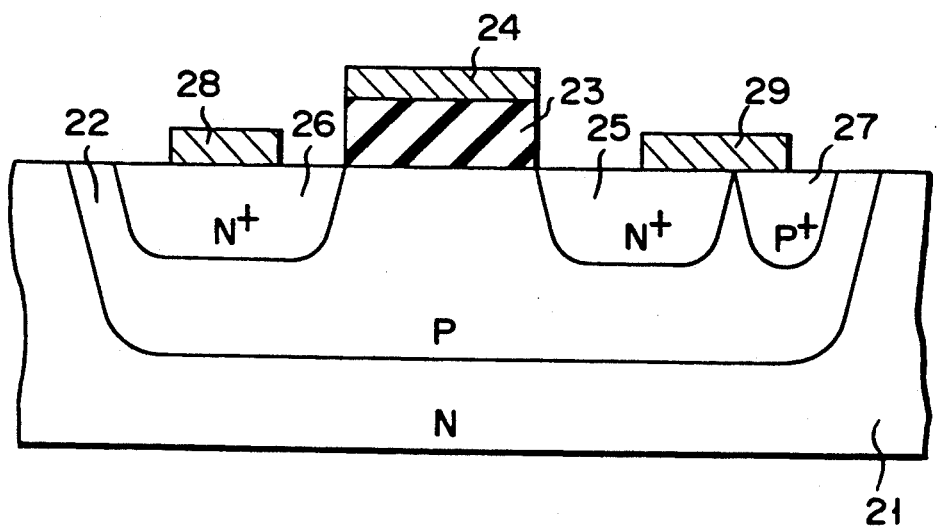
FIG. 8 is a sectional view showing another example of the memory cell shown in FIG. 3.

The transistor TM used in the above embodiment is a P-channel FET having a gate insulation film made of ferroelectric material. However, according to preferred embodiment of the invention, as shown in FIG. 8, the P-channel FET can be replaced by an N-channel FET having a gate insulation film made of ferroelectric material. The principle of the polarization in the N-channel FET is basically the same as in the P-channel FET, though the directions of the electric field to be applied and the polarities of the charges are reversed.

More specifically, when an electric field is applied which extends from the well region 22 to the control gate electrode 24 as is illustrated in FIG. 9A, the gate insulation film 23 is polarized, where positive charges are drawn toward the control gate electrode 24. Even when the gate control electrode 24 is set at the ground potential, and thus the electric field is no longer applied, the gate insulation film 23 remains polarized toward the control gate electrode 24. The surface region of the well region 22 therefore accumulates positive charges 51 to cancel out the negative charges 50 accumulated in the film 23, and thus forms a positive charge accumulating layer 51. As a result, the source region 25 and the drain region 26 are electrically isolated from each other by this positive charge accumulating layer 51.

On the other hand, when an electric field is applied which extends from the control gate electrode 24 to the well region 22 as is illustrated in FIG. 9B, the gate insulation film 23 is also polarized, where positive charges are drawn toward the well region 22. In this case, even when the well region 22 and the electrode 24 are set at the ground potential, and thus the electric field is no longer applied, the gate insulation film 23 remains polarized toward the well region 22. The surface region of the well region 22 therefore accumulate negative charges 53 to cancel out the positive charges 52 accumulated in the film 23, and thus forms a negative charge accumulating layer 53. As a result, the source region 25 and the drain region 26 are electrically connected by this negative charge accumulating layer 53.

As can be understood from the above, a "1" bit or a "0" bit is written into the MOS transistor TM by applying an electric field which extends either from the well region 22 to the control gate electrode 24, or from the control gate electrode 24 to the well region 22, thereby forming a positive or negative charge accumulating layer in the gate insulation film 23 made of ferroelectric material.

Furthermore, in the embodiments described above, the gate insulation film 23 is formed on a portion of the N-type well region 22. Nonetheless, as is illustrated in FIG. 10, the film 23 can be formed on an insulation film 61 made of non-ferroelectric material such as SiO₂, which is formed on the portion of the well region 22. The insulation film 61 enhances a crystal matching between the gate insulation film 23 made of ferroelectric material and the well region 22. The film 61 should be as thin as possible, so as not to influence the polarized state of the gate insulation film 23 made of ferroelectric material.

Further, as is shown in FIG. 11, an extremely thin insulation film 62 made of non-ferroelectric material such as SiO₂ can be formed between the gate insulation film 23 and the control gate electrode 24. This film 62 increases a crystal matching between the gate insulation film 23 and the control gate electrode 24. In this case, too, the film 62 should be as thin as possible, so as not to influence the polarized state of the gate insulation film 23 made of ferroelectric material.

Still further, as is illustrated in FIG. 12, an insulation film 61 made of non-ferroelectric material such as SiO₂ can be formed between a portion of the N-type well region 22 and the gate insulation film 23 made of ferroelectric material, and another insulation film 62 also made of non-ferroelectric material can be formed between the gate insulation film 23 and the control gate electrode 24. The film 61 improves a crystal matching between the film 23 to the well region 22, whereas the film 62 improves a crystal matching between the gate insulation film 23 and the control gate electrode 24. In this case, too, the film 62 should be as thin as possible, so as not to influence the polarized state of the gate insulation film 23 made of ferroelectric material.

Figure 13:
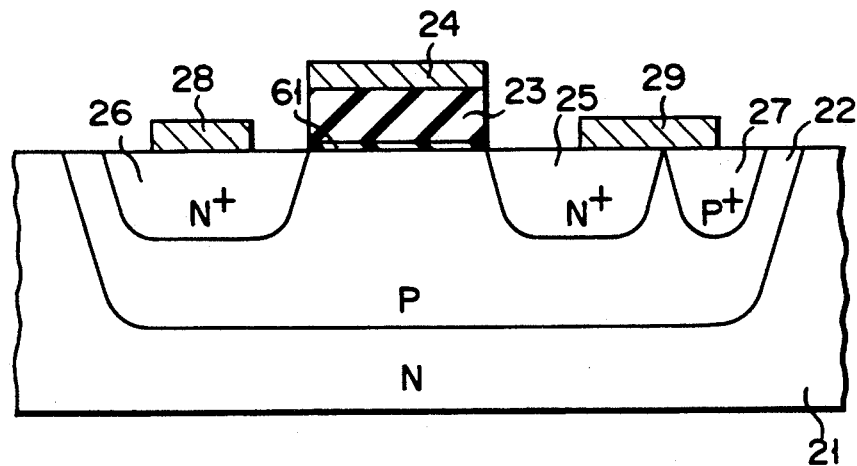
FIG. 13 is a sectional view showing a modification of the memory cell shown in FIG. 8.
Figure 14:
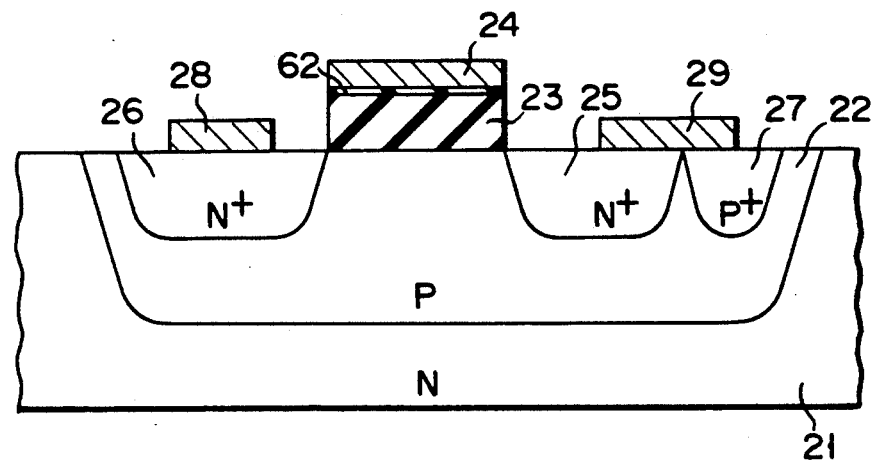
FIG. 14 is a sectional view showing another modification of the memory cell shown in FIG. 8.
Figure 15:
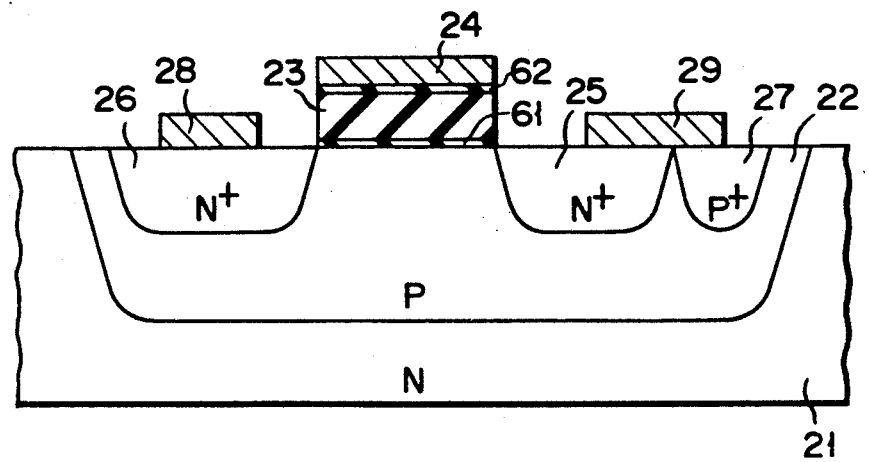
FIG. 15 is a sectional view showing a further modification of the memory cell shown in FIG. 8.

The transistors TM shown in FIGS. 10, 11 and 12 are P-channel FETs. Nonetheless, according to the present invention, these P-type FETs can be replaced by N-type FETs which are identical in structure to the P-type FETs, but different in the conductivity type of each component as is illustrated in FIGS. 13, 14, and 15. These N-type FETs have the same advantages as the P-type FETs shown in FIGS. 10, 11, and 12.

As may be understood from the above, the present invention can provide a nonvolatile semiconductor memory which has memory cells each comprising an FET having a ferroelectric gate insulating film, and which can rewrite data in a short period of time.

What is claimed is:

1. A nonvolatile semiconductor memory, having a reference-potential source, a first word line, a second word line, and a bit line, comprising an array of memory cells arranged in rows and columns, each memory cell comprising:
    a first field-effect transistor including a ferroelectric insulation film, a gate coupled to the reference-potential source, a source, and a drain;
    a second field-effect transistor including a gate coupled to the first word line, and a source-drain path having one end coupled to the source of the first field-effect transistor and another end; and
    a third field-effect transistor including a gate coupled to the second word line, and a source-drain path having one end coupled to the drain of the first field effect transistor and another end,
    wherein one of the other ends of the second and third field-effect transistors is coupled to the bit line and the other of the other ends of the second and third field-effect transistors is coupled to the reference-potential source.

2. The nonvolatile semiconductor memory according to claim 1, wherein said ferroelectric insulation film is BaTiO3.

3. The nonvolatile semiconductor memory according to claim 1, wherein said ferroelectric insulation film is lead zirconate titanate.

4. The nonvolatile semiconductor memory according to claim 1, wherein said ferroelectric insulation film is a ferroelectric gate insulation film, and said first field-effect transistor comprises a semiconductor substrate and a non-ferroelectric insulation film between the semiconductor substrate and said ferroelectric gate insulation film.

5. The nonvolatile semiconductor memory according to claim 4, wherein said non-ferroelectric insulation film is made of $SiO_2$.

6. The nonvolatile semiconductor memory according to claim 1, wherein said ferroelectric insulation film is a ferroelectric gate insulation film, and said first field-effect transistor comprises a control gate electrode and a non-ferroelectric insulation film between said ferroelectric gate insulation film and the control gate electrode.

7. The nonvolatile semiconductor memory according to claim 6, wherein said non-ferroelectric insulation film is made of $SiO_2$.

8. The nonvolatile semiconductor memory according to claim 1, wherein said ferroelectric insulation film is a ferroelectric gate insulation film, and said first field-effect transistor comprises a semiconductor substrate, a control gate electrode, a first non-ferroelectric insulation film formed between the semiconductor substrate and said ferroelectric gate insulation film, and a second non-ferroelectric insulation film formed between the ferroelectric gate insulation film and the control gate electrode.

9. The nonvolatile semiconductor memory according to claim 8, wherein said first and second non-ferroelectric insulation films are made of $SiO_2$.

10. The nonvolatile semiconductor memory according to claim 1, wherein said first field-effect transistor comprises an N-channel type field-effect transistor.

11. The nonvolatile semiconductor memory according to claim 10, wherein said ferroelectric insulation film is a ferroelectric gate insulation film, and said first field-effect transistor comprises a semiconductor substrate and a non-ferroelectric insulation film formed between the semiconductor substrate and said ferroelectric gate insulation film.

12. The nonvolatile semiconductor memory according to claim 11, wherein said non-ferroelectric insulation film is made of $SiO_2$.

13. The nonvolatile semiconductor memory according to claim 10, wherein said ferroelectric insulation film is a ferroelectric gate insulation film, and said first field-effect transistor comprises a control gate electrode and a non-ferroelectric insulation film formed between said ferroelectric gate-insulation film and the control gate electrode.

14. The nonvolatile semiconductor memory according to claim 13, wherein said non-ferroelectric insulation film is made of $SiO_2$.

15. The nonvolatile semiconductor memory according to claim 10, wherein said ferroelectric insulation film is a ferroelectric gate insulation film, and said first field-effect transistor comprises a semiconductor substrate, a control gate electrode, a first non-ferroelectric insulation film formed between the semiconductor substrate and said ferroelectric gate-insulation film, and a second non-ferroelectric insulation film formed between the ferroelectric gate insulation film and the control gate electrode.

16. The nonvolatile semiconductor memory according to claim 12, wherein said first and second non-ferroelectric insulation films are made of $SiO_2$.

17. The nonvolatile semiconductor memory according to claim 1, wherein said first field-effect transistor comprises a P-channel type field-effect transistor.

18. The nonvolatile semiconductor memory according to claim 17, wherein said ferroelectric insulation film is a ferroelectric gate insulation film, and said first field-effect transistor comprises a semiconductor substrate and a non-ferroelectric insulation film formed between the semiconductor substrate and said ferroelectric gate insulation film.

19. The nonvolatile semiconductor memory according to claim 18, wherein said non-ferroelectric insulation film is made of $SiO_2$.

20. The nonvolatile semiconductor memory according to claim 17, wherein said ferroelectric insulation film is a ferroelectric gate insulation film, and said first field-effect transistor comprises a control gate electrode and a non-ferroelectric insulation film formed between said ferroelectric gate insulation film and the control gate electrode.

21. The nonvolatile semiconductor memory according to claim 20, wherein said non-ferroelectric insulation film is made of $SiO_2$.

22. The nonvolatile semiconductor memory according to claim 17, wherein said ferroelectric insulation film is a ferroelectric gate insulation film, and said first field-effect transistor comprises a semiconductor substrate, a control gate electrode, a first non-ferroelectric insulation film formed between the semiconductor substrate and said ferroelectric gate insulation film, and a second non-ferroelectric insulation film formed between the ferroelectric gate insulation film and the control gate electrode.

23. The nonvolatile semiconductor memory according to claim 22, wherein said first and second non-ferroelectric insulation films are made of $SiO_2$.

* * * * *